United States Patent

Robbins et al.

(10) Patent No.: US 6,300,294 B1
(45) Date of Patent: Oct. 9, 2001

(54) LUBRICANT DELIVERY FOR MICROMECHANICAL DEVICES

(75) Inventors: Roger A. Robbins, Allen; Simon Joshua Jacobs, Lucas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/435,416

(22) Filed: Nov. 8, 1999

Related U.S. Application Data

(60) Provisional application No. 60/108,619, filed on Nov. 16, 1998.

(51) Int. Cl.$^7$ ............... C10M 129/91; C10M 131/12
(52) U.S. Cl. ............... 508/524; 508/307; 508/579; 427/421; 427/422; 427/435
(58) Field of Search ............... 508/524, 579, 508/307; 427/421, 422, 435

(56) References Cited

U.S. PATENT DOCUMENTS

| | | | |
|---|---|---|---|
| 5,061,049 | 10/1991 | Hornbeck | 359/224 |
| 5,331,454 | 7/1994 | Hornbeck | 359/224 |
| 5,512,374 | * 4/1996 | Wallace et al. | 428/422 |
| 5,583,688 | 12/1996 | Hornbeck | 359/291 |
| 5,939,785 | 8/1999 | Klonis et al. | 257/729 |

FOREIGN PATENT DOCUMENTS 0 845 301 A1    6/1998   (EP) .

* cited by examiner

*Primary Examiner*—Jacqueline V. Howard
(74) *Attorney, Agent, or Firm*—Charles A. Brill; Wade James Brady, III; Frederick J. Telecky, Jr.

(57) ABSTRACT

A method of dispensing a lubricant into a micromechanical device package and a micromechanical device package containing the lubricant. The method comprises the steps of mixing (102) the lubricant, typically a perfluoroalkanoic acid such as perfluorodecanoic acid with a suitable solvent, typically an ether solvent such as tetrahydrofuran or tert-butyl methyl ether. The mixture is allowed to equilibrate (104) before being filtered (106) to remove solid particles. The filtered solution is applied (108) to a surface that will be on the interior of the package, typically the ceramic substrate. The deposited mixture is then cured (110) to remove most, if not all, of the solvent, and the package is sealed (112).

17 Claims, 1 Drawing Sheet

LUBRICANT DELIVERY FOR MICROMECHANICAL DEVICES

CROSS-REFERENCE TO RELATED APPLICATIONS

This application claims priority under 35 USC 119(e)1 of provisional application No. 60/108,619 filed Nov. 16, 1998.

The following patents and/or commonly assigned patent applications are hereby incorporated herein by reference:

| Patent No. | Filing Date | Issue Date | Title |
| --- | --- | --- | --- |
| 5,061,049 | Sept. 13, 1990 | Oct. 29, 1991 | Spatial Light Modulator and Method |
| 5,331,454 | Jan. 16, 1992 | July 19, 1994 | Low Reset Voltage Process for DMD |
| 5,583,688 | Dec. 21, 1993 | Dec. 10, 1996 | Multi-Level Digital Micromirror Device |
| 5,939,785 | April 4, 1997 | Aug. 17, 1999 | Micromechanical Device Including Time-Release Passivant |
| 08/971,810 | Nov. 17, 1997 | | Monolayer Lubricant for Micromachines (now abandoned) |
| 09/406,386 | Sept. 27, 1999 | | Surface Treatment Material Deposition and Recapture |
| 09/416,910 | Oct. 13, 1999 | | Getter for Enhanced Micromechanical Device Performance |

FIELD OF THE INVENTION

This invention relates to the field of lubricating compounds, particularly to the deposition of lubricating compounds for micromechanical devices.

BACKGROUND OF THE INVENTION

Electronic devices such as integrated circuits are often packaged in hermetically sealed enclosures. These enclosures protect the device from contaminants, particles, and water vapor that would otherwise enter the package and mechanically damage or electrically disrupt the device. The hermetic packages, however, do not perfectly seal out these elements over the life of the device. Additionally, some water vapor and debris is present in the enclosure cavity when the enclosure is sealed, or evolved by the packaging materials as the materials cure.

Getters, compounds that capture contaminants, moisture vapor, and particles, are included inside the device enclosures to trap these species and preclude degradation of device performance, thereby increasing the operational lifetime of the device. Various getter compounds are available depending on the environment to which the getter will be subjected.

Existing getter compounds are unsatisfactory for use with many modem micromechanical devices. Micromechanical devices are small structures typically fabricated on a semiconductor wafer using techniques such as optical lithography, doping, metal sputtering, oxide deposition, and plasma etching which have been developed for the fabrication of integrated circuits. Typical micromechanical devices include accelerometers, pressure sensors, micro-motors, and microrirrors.

Because of their small size, often less than 100 microns, micromechanical devices are very susceptible to damage from debris inside the micromechanical device package. For example, debris can easily obstruct the motion of, or electrically short-circuit, micromirror elements which are often no larger than 17 microns.

Many micromechanical devices include moving components that place unique demands on surface lubrication and passivation systems. For example, the deflectable element of a micromirror device rotates about a torsion beam hinge axis and is stopped by contact with a landing zone or spring structure. The contact point experiences metal-to-metal contact and some scrubbing action. This metal-to-metal contact can create sticking and friction (stiction) between the moving components. Stiction is caused by the capillary action of water vapor present on the surface, van der Waals attraction, and intermetallic bonding of the metals. Stiction becomes worse as the contacting surfaces wear against each other since the contact area is increased.

Passivation coatings on micromirror devices reduce stiction and wear between the contacting surfaces. One passivation material that is especially useful for micromirror devices is perfluorodecanoic acid (PFDA). PFDA, as taught by U.S. Pat. No. 5,331,454, issued Jul. 19, 1994 and entitled Low Voltage Reset for DMD, provides an oriented monolayer on the surfaces of the DMD. The oriented monolayer provides a chemically inert surface that reduces the stiction between adjacent metal parts.

Unfortunately, the PFDA forms a relatively weak bond between with the aluminum surfaces on which it is deposited. Because of the weak bond between the PFDA and the aluminum surfaces of the micromirror device, the scrubbing action between contacting parts wears the oriented monolayer and exposes the underlying aluminum. Without replenishment, exposed aluminum regions grow and eventually create unacceptably large stiction forces—ruining the device.

As taught in U.S. Pat. No. 5,939,785 entitled Micromechanical Device Including Time-Release Passivant, and U.S. patent application Ser. No. 60/105,269, entitled Getter for Enhanced Micromechanical Device Performance, a getter compound is included in the sealed enclosure containing the device. A getter compound is chosen that reversibly combines with the lubricant, generally a perfluoroalkanoic acid such as perfluorodecanoic acid (PFDA). Thus, the getter acts as a reservoir to source and store PFDA while maintaining a PFDA vapor within the package. The PFDA vapor condenses onto exposed surfaces of the device to maintain the monolayer.

PFDA is presently placed in the device package by a remote vapor deposition process described in U.S. patent application Ser. No. 60/102,438, entitled Surface Treatment Material Deposition and Recapture. As described therein, the lubricant is evaporated into a carrier gas and transported by the carrier gas to a heated deposition chamber. Once in the deposition chamber, the lubricant condenses out of the carrier gas forming a monolayer on the devices in the deposition chamber. The carrier gas also forms a monolayer on the surfaces of any ductwork and the deposition chamber itself.

While an improvement over prior systems, the vapor deposition and recapture process can be wasteful of the lubricant and require extensive periodic maintenance. For example, if the ductwork and deposition chamber are not kept sufficiently warm, large quantities of the lubricant will condense out of the carrier gas, clogging the deposition system and requiring the system to be disassembled and cleaned. What is needed is an improved method of delivering lubricant to the micromechanical device package that is not wasteful of the lubricant and does not require complex delivery mechanisms.

SUMMARY OF THE INVENTION

Objects and advantages will be obvious, and will in part appear hereinafter and will be accomplished by the present invention which provides a method and system for the delivery of a lubricant for micromechanical devices. One embodiment of the claimed invention provides a method of applying a lubricant to a micromechanical device package comprising the steps of: mixing said lubricant with a suitable solvent, applying the lubricant and solvent mixture to an interior package surface, and sealing the micromechanical device package.

Another embodiment of the claimed invention provides a method of applying a lubricant to a micromechanical device package comprising the steps of: mixing a carboxylic acid lubricant, such as a perfluoroalkanoic acid or perfluorodecanoic acid, with an ethereal solvent; applying the lubricant and solvent mixture to an interior package surface; curing the lubricant and solvent mixture to remove at least some of the solvent; and sealing the micromechanical device package.

According to yet another embodiment of the disclosed invention, a display system is disclosed. The display system comprises a light path, a controller for generating image signals, and a micromirror device. The micromitror device is disposed along said light path and is operable to selectively reflect portions of light traveling along said light path in response to the image signals. The micromirror device is in a package containing a carboxylic acid lubricant, such as perfluoroalkanoic acid, more specifically perfluorodecanoic acid, deposited from solution of an ethereal solvent.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Lubricating micromechanical devices is a challenge due to the very small clearances between moving parts and the very small forces used to operate the devices. Some micromechanical devices, such as micromirror devices, are easily destroyed by contact with moving fluids. Therefore even applying the lubricant to the micromechanical device in a manner that supports high-volume manufacture of the devices can be quite difficult.

A new method of applying a lubricant to micromechanical devices has been developed. The method allows the direct deposition of the lubricant to surfaces inside the micromechanical device package and is suitable for use in fully automated product flows capable of supporting high volume manufacturing.

Figure 1:
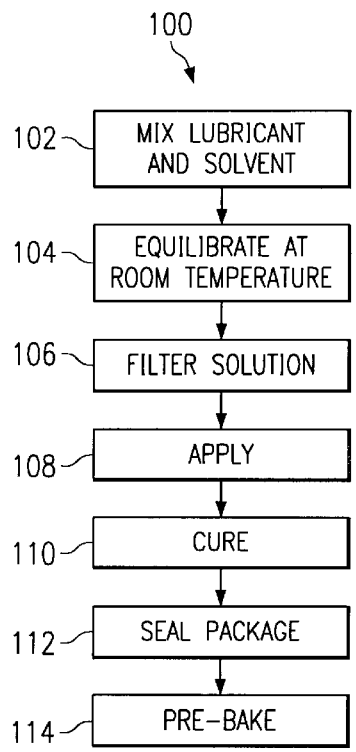
FIG. 1 is a flow chart of the process of mixing, applying, and curing the lubricant material.

FIG. 1 is a flowchart 100 of the new process of applying the lubricant to a micromechanical device package. In step 102 of FIG. 1, the lubricant is mixed with a suitable solvent. The lubricant generally is a carboxylic acid, more specifically a perfluoroalkanoic acid such as perfluorodecanoic acid (PFDA). The selection of a proper solvent is critical to this application. A suitable solvent evaporates without leaving harmful residue, and the lubricant remaining after evaporation of the solvent should be in the desired form. That is, the lubricant is mechanically robust against, and highly localized within, the small confines allowed it within the micromechanical package. Furthermore, the solvent must combine with the lubricant to form a mixture that is stable over an extended period of time.

There are many efficacious organic solvents for PFDA, but only a limited number that will form mixtures with PFDA that are suitable for this dispensing method. Since perfluoroalkanoic acids such as PFDA are strong acids, they are capable of catalyzing a wide range of reactions with unsuitable solvents, such as condensation and elimination reactions. These reactions lead to undesirable byproducts whose presence in the package can cause stiction.

Ethers are desirable solvents for use with perfluoroalkanoic acid lubricants, especially with PFDA. The particular ethers that are ideal for use with PFDA are tetrahydrofuran (THF) and tert-butyl methyl ether (MTBE). Both THF and MTBE have excellent solvating power for PFDA, are inert to long exposure to PFDA, evaporate quickly, and leave behind solid PFDA without undesirable contaminants.

Solvents that do not give good results are esters and ketones. Esters and ketones undergo acid catalyzed reactions under long exposure to PFDA and evaporate significantly slower than the ethers described above.

The chosen lubricant and solvent typically are mixed by adding lubricant to a fixed volume of solvent until no more lubricant dissolves. When using PFDA as the lubricant, the resulting mixture typically is 80% PFDA and 20% solvent by weight. Less concentrated solutions can be used, but the very low surface tension and viscosity of such mixtures makes it difficult to control the delivery process.

The dissolution process is typically endothermic, so time must be allowed for the saturated solution to reach equilibrium at room temperature as shown by step 104 of FIG. 1. Thirty minutes or more are typically allowed for the solution to reach room temperature.

After the solution reaches equilibrium, it is filtered in step 106 of FIG. 1. using a Teflon filter having 1.0 micron pores. The filter step 106 of FIG. 1. removes fine particles of undissolved lubricant from the solution. The filtered solution is then applied to the package interior in step 108 of FIG. 1.

The solution prepared by this process is adapted for the use of automated dispense equipment. The automated dispense equipment typically delivers a small amount, 5 to 20 mg, of the dissolved PFDA to an interior surface of the package by extruding the dissolved solution from a syringe. Alternate methods of applying the solution to the package interior include spraying the solution into the package interior and dipping part of the package interior into the solution. The solution can be dispensed onto any surface inside the package. For best results, the solution is deposited on the ceramic substrate.

After the solution is dispensed, it is cured by evaporating the solvent as shown in step 110 of FIG. 1. At room temperature, the cure process takes about five minutes. The cure process can be accelerated by placing the device in a warm environment, typically 40° to 50° C. After the solvent is evaporated, the package is sealed as indicated by step 112 of FIG. 1. Typical micromirror packages are sealed by seam welding a metal-framed window 210 shown in FIG. 2, onto a spacer ring 212 attached to a ceramic package substrate 208.

After the package is sealed in step 112 of FIG. 1, the package is heated to distribute the lubricant. The pre-bake step 114 shown in FIG. 1 is typically a 150° C. bake for 12 hours to effect the evaporation of the lubricant. The evaporated lubricant forms a monolayer on the interior surfaced of the package and on the surfaces of the micromechanical device. As described in U.S. patent application Ser. No. 60/102,438 entitled "Surface Treatment Material Deposition and Recapture," and U.S. patent application Ser. No. 60/105,269 entitled "Getter for Enhanced Micromechanical Device Performance," the lubricant is also absorbed by a getter inside the package. The getter acts as a reversible source/sink of lubricant material to maintain a lubricant vapor within the package in order to effect repair of the monolayer as it is abraded by device operation.

Figure 2:
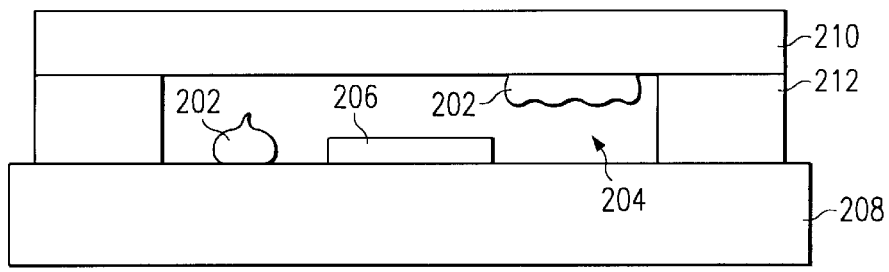
FIG. 2 is a cross-section view of a packaged micromechanical device showing the presence of a reversible source/sink for a lubricant and a quantity of the lubricant applied in FIG. 1.

FIG. 2 shows a typical micromechanical device 206 on a ceramic substrate 208. A metal framed window 210 is separated from the ceramic substrate 208 by a spacer ring 212 to form a headspace 204 surrounding the micromechanical device 206. The metal framed window 210 is typically seam welded to the spacer ring 212, but the window can also be bonded to the ring using a suitable adhesive such as epoxy.

FIG. 2 shows the location of the lubricant 202 within the package as applied by the new process. Although the best results are obtained by applying the lubricant 202 to the ceramic substrate, the lubricant 202 can also be applied to the package lid, shown as glass window 210, or even to some types of micromechanical devices 206.

Figure 3:
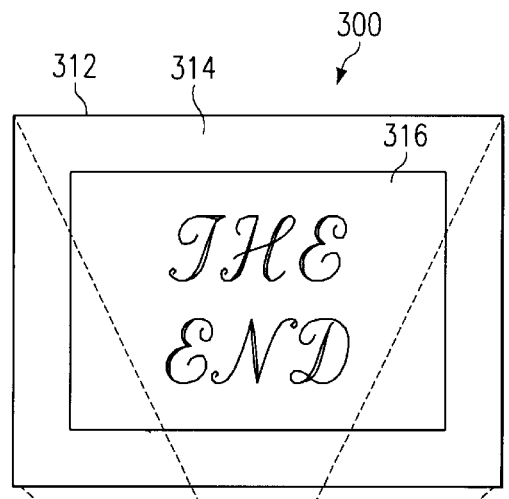
FIG. 3 is a schematic view of a micromirror-based projection system utilizing the improved micromechanical device of FIG. 2.

FIG. 3 is a schematic view of an image projection system 300 using a micromirror device 302 having a lubricant deposited according to the present invention. In FIG. 3, light from light source 304 is focused on the improved micromirror 302 by lens 306. Although shown as a single lens, lens 306 is typically a group of lenses and mirrors which together focus and direct light from the light source 304 onto the surface of the micromirror device 302. Image data and control signals from controller 314 cause some mirrors to rotate to an on position and others to rotate to an off position. Mirrors on the micromirror device that are rotated to an off position reflect light to a light trap 308 while mirrors rotated to an on position reflect light to projection lens 310, which is shown as a single lens for simplicity. Projection lens 310 focuses the light modulated by the micromirror device 302 onto an image plane or screen 312.

Thus, although there has been disclosed to this point a particular embodiment for a lubricant delivery method for micromechanical devices and a micromechanical device fabricated using the process, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of applying a lubricant to a micromechanical device package, the method comprising the steps of:
   mixing said lubricant with a suitable solvent;
   applying said lubricant and solvent mixture to an interior surface of said micromechanical device package;
   sealing said micromechanical device package; and
   baking said sealed micromechanical device package to distribute said lubricant.

2. The method of claim 1, further comprising the step of:
   filtering said mixture using a Teflon filter having 1.0 micron pores.

3. The method of claim 1, further comprising the step of:
   curing said lubricant and solvent mixture to remove the majority of said solvent.

4. The method of claim 3, said curing step comprising the step of:
   heating said mixture to between 40 and 50° C.

5. A method of applying a lubricant to a micromechanical device package, the method comprising the steps of:
   mixing a carboxylic acid lubricant with a suitable solvent;
   applying said lubricant and solvent mixture to an interior surface of said micromechanical device package;
   sealing said micromechanical device package; and
   baking said sealed micromechanical device package to distribute said lubricant.

6. A method of applying a lubricant to a micromechanical device package, the method comprising the steps of:
   mixing a perfluoroalkanoic acid lubricant with a suitable solvent;
   applying said lubricant and solvent mixture to an interior surface of said micromechanical device package;
   sealing said micromechanical device package; and
   baking said sealed micromechanical device package to distribute said lubricant.

7. A method of applying a lubricant to a micromechanical device package, the method comprising the steps of:
   mixing perfluorodecanoic acid lubricant with a suitable solvent;
   applying said lubricant and solvent mixture to an interior surface of said micromechanical device package;
   sealing said micromechanical device package; and
   baking said sealed micromechanical device package to distribute said lubricant.

8. The method of claim 1, further comprising the step of:
   mixing a lubricant with an ethereal solvent.

9. The method of claim 1, further comprising the step of:
   mixing a lubricant with tetrahydrofuran.

10. The method of claim 1, further comprising the step of:
    mixing a lubricant with tert-butyl methyl ether.

11. A method of applying a lubricant to a micromechanical device package, the method comprising the steps of:
    mixing a perfluoroalkanoic acid lubricant with an ethereal solvent;
    applying said lubricant and solvent mixture to an interior package surface;
    curing said lubricant and solvent mixture to remove at least some of said solvent; and
    sealing said micromechanical device package.

12. The method of claim 11, further comprising the step of:
    baking said sealed micromechanical device package to distribute said lubricant.

13. The method of claim 11, further comprising the step of:
    baking said sealed micromechanical device package to evaporate said lubricant.

14. A method applying a lubricant to a micromechanical device package, the method comprising the steps of:

mixing said lubricant with a suitable solvent;

applying said lubricant and solvent mixture to an interior surface of said micromechanical device package;

sealing said micromechanical device package; and baking said sealed micromechanical device package to evaporate said lubricant.

15. A method of applying a lubricant to a micromechanical device package, the method comprising the steps of:

mixing a carboxylic acid lubricant with a suitable solvent;

applying said lubricant and solvent mixture to an interior surface of said micromechanical device package;

sealing said micromechanical device package; and baking said sealed micromechanical device package to evaporate said lubricant.

16. A method of applying a lubricant to a micromechanical device package, the method comprising the steps of:

mixing a perfluoroalkanoic acid lubricant with a suitable solvent;

applying said lubricant and solvent mixture to an interior surface of said micromechanical device package;

sealing said micromechanical device package; and baking said sealed micromechanical device package to evaporate said lubricant.

17. A method of applying a lubricant to a micromechanical device package, the method comprising the steps of:

mixing perfluorodecanoic acid lubricant with a suitable solvent;

applying said lubricant and solvent mixture to an interior surface of said micromechanical device package;

sealing said micromechanical device package; and baking said sealed micromechanical device package to evaporate said lubricant.

* * * * *